(12) United States Patent
Rice et al.

(10) Patent No.: US 12,205,843 B2
(45) Date of Patent: Jan. 21, 2025

(54) GROUND ELECTRODE FORMED IN AN ELECTROSTATIC CHUCK FOR A PLASMA PROCESSING CHAMBER

(71) Applicant: Applied Materials, Inc., Santa Clara, CA (US)

(72) Inventors: Michael R. Rice, Pleasanton, CA (US); Vijay D. Parkhe, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/141,223

(22) Filed: Apr. 28, 2023

(65) Prior Publication Data

US 2023/0268218 A1 Aug. 24, 2023

Related U.S. Application Data

(62) Division of application No. 16/600,997, filed on Oct. 14, 2019, now Pat. No. 11,640,917.

(60) Provisional application No. 62/778,808, filed on Dec. 12, 2018, provisional application No. 62/776,896, filed on Dec. 7, 2018.

(51) Int. Cl.
| | |
|---|---|
| *H01L 21/683* | (2006.01) |
| *H01J 37/32* | (2006.01) |
| *H01L 21/67* | (2006.01) |
| *H01T 23/00* | (2006.01) |

(52) U.S. Cl.
CPC .... *H01L 21/6833* (2013.01); *H01J 37/32724* (2013.01); *H01L 21/67103* (2013.01); *H01J 2237/002* (2013.01); *H01J 2237/3321* (2013.01)

(58) Field of Classification Search
CPC ............ H01L 21/6833; H01L 21/67103; H01J 37/32724
USPC .......................................................... 361/234
See application file for complete search history.

(56) References Cited

U.S. PATENT DOCUMENTS

| | | |
|---|---|---|
| 6,639,783 B1 | 10/2003 | Shamouilian et al. |
| 9,087,679 B2 | 7/2015 | Rasheed et al. |
| 9,287,147 B2 | 3/2016 | Tantiwong et al. |
| 9,382,621 B2 | 7/2016 | Choi et al. |

(Continued)

FOREIGN PATENT DOCUMENTS

| | | |
|---|---|---|
| CN | 102106191 B | 1/2014 |
| TW | 201239944 A | 10/2012 |

(Continued)

OTHER PUBLICATIONS

International Search Report and Written Opinion for PCT/US2019/056079 dated Jan. 30, 2020.

(Continued)

*Primary Examiner* — Jared Fureman
*Assistant Examiner* — Lucy M Thomas
(74) *Attorney, Agent, or Firm* — Patterson + Sheridan, LLP

(57) ABSTRACT

Disclosed herein is a substrate support assembly having a ground electrode mesh disposed therein along a side surface of the substrate support assembly. The substrate support assembly has a body. The body has an outer top surface, an outer side surface and an outer bottom surface enclosing an interior of the body. The body has a ground electrode mesh disposed in the interior of the body and adjacent the outer side surface, wherein the ground electrode does not extend through to the outer top surface or the outer side surface.

4 Claims, 8 Drawing Sheets

(56) References Cited

U.S. PATENT DOCUMENTS

| | | |
|---|---|---|
| 9,404,176 B2 | 8/2016 | Parkhe et al. |
| 9,692,325 B2 | 6/2017 | Suuronen et al. |
| 11,049,755 B2* | 6/2021 | Benjaminson .... H01L 21/67103 |
| 2010/0243606 A1 | 9/2010 | Koshimizu et al. |
| 2014/0069584 A1 | 3/2014 | Yang et al. |
| 2014/0231019 A1 | 8/2014 | Kajihara |
| 2016/0049323 A1* | 2/2016 | Ye ........................ H01L 21/6833 |
| | | 361/234 |
| 2016/0148828 A1 | 5/2016 | Parkhe |
| 2017/0306494 A1 | 10/2017 | Lin et al. |
| 2021/0242062 A1* | 8/2021 | Jung ................... C23C 16/4581 |

FOREIGN PATENT DOCUMENTS

| | | |
|---|---|---|
| TW | 201714200 A | 4/2017 |
| WO | 2017165032 A1 | 9/2017 |

OTHER PUBLICATIONS

Taiwan Office Action for Application No. 108140959 dated Jul. 7, 2023.
Taiwan Office Action for Application No. 113108089 dated Nov. 11, 2024.

* cited by examiner

GROUND ELECTRODE FORMED IN AN ELECTROSTATIC CHUCK FOR A PLASMA PROCESSING CHAMBER

CROSS-REFERENCE TO RELATED APPLICATIONS

This application is a divisional of U.S. Non-Provisional patent application Ser. No. 16/600,997, filed Oct. 14, 2019, which claims benefit of U.S. Provisional Application Ser. No. 62/778,808, filed Dec. 12, 2018, and U.S. Provisional Application Ser. No. 62/776,896, filed Dec. 7, 2018 all of which are incorporated by reference in their entirety.

BACKGROUND

Field

Embodiments of the present disclosure generally relate to plasma processing chambers. More particularly, embodiments of the present disclosure relate to a ground electrode for a substrate support assembly disposed in a plasma processing chamber.

Description of the Related Art

Plasma processing systems are used to form devices on a substrate, such as a semiconductor wafer or a transparent substrate. Often the substrate is held to a support for processing. The substrate may be held to the support by vacuum, gravity, electrostatic forces, or by other suitable techniques. During processing, The precursor gas or gas mixture in the chamber is energized (e.g., excited) into a plasma by applying a power, such as a radio frequency (RF) power, to an electrode in the chamber from one or more power sources coupled to the electrode. The excited gas or gas mixture reacts to form a layer of material on a surface of the substrate. The layer may be, for example, a passivation layer, a gate insulator, a buffer layer, and/or an etch stop layer.

During Plasma Enhanced Chemical vapor Deposition (PECVD), a capacitively coupled plasma, also known as a source plasma, is formed between the substrate support and the gas distribution plate. A RF return path of the plasma passes through the substrate support and chamber liner. Non-uniformity or skew of processing results (e.g., etch, deposition and the like) may be caused by asymmetry of the RF return path due bad or a broken ground. The processing chambers typically include a substrate support or pedestal disposed therein to support the substrate during processing and a showerhead having a faceplate for introducing process gas into the processing chamber. The plasma is generated by two RF electrodes, where the showerhead functions as the top electrode, cathode, and the substrate support functions as the bottom electrode, anode. In some processes, the pedestal may include an embedded metal mesh to serve as the bottom electrode. Process gas flows through showerhead and the plasma is generated between the two electrodes. In conventional systems, RF current flows from the showerhead top electrode to heater bottom electrode through the plasma. The RF current will pass a nickel RF rod in the pedestal, and return back in the inner chamber wall through the pedestal structure. The RF return path provides process stability and prevents arcing in the chamber extending the service life of the chamber components. However, the vertical wall of the substrate support is largely left without a proper ground which in term may promote the formation of parasitic plasma below the support surface of the substrate support.

Therefore, there is a need for an improved RF return path in the plasma processing chamber.

SUMMARY

Disclosed herein is a substrate support assembly having a ground electrode mesh disposed therein along a side surface of the substrate support assembly and a method for forming the ground electrode mesh. The substrate support assembly has a body. The body has an outer top surface, an outer side surface and an outer bottom surface enclosing an interior of the body. The body has a ground electrode mesh disposed in the interior of the body and adjacent the outer side surface, wherein the ground electrode does not extend through to the outer top surface or the outer side surface.

Disclosed herein is a method for forming an electrostatic chuck (ESC). The method begins by sintering an aluminum nitride (AlN) or aluminum oxide body having a heater, an RF electrode mesh and a high voltage (HV) ESC electrode mesh. A ground electrode mesh is disposed along one or more outer surfaces of the sintered AlN body. The ground electrode mesh and the sintered body is encased in an aluminum powder to form an ESC body. The ESC body is sintered to form the ESC.

Disclosed herein is another method for forming an ESC. The method begins by printing an RF electrode on a top surface of a first sheet of AlN. A plurality of first vias is formed in the first sheet of AlN. A heater is printed on a top surface of a second sheet of AlN. A plurality of second vias is formed in the second sheet of AlN. The second vias are vertically aligned with the first vias. An HV ESC electrode is printed on a top surface of a third sheet of AlN. A plurality of third vias is formed in the third sheet of AlN. The third vias are vertically aligned with the first vias. A ground mesh is printed on a top surface of a fourth sheet of AlN. A plurality of fourth vias is formed in the fourth sheet of AlN. The fourth vias are vertically aligned with the first vias. A fifth sheet of AlN is placed on the top surface of the first sheet to for the ESC body.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a vertical ground electrode disposed along a periphery of a substrate support for use in a plasma processing chamber. A substrate support assembly includes the substrate support and a stem. The substrate support has a ceramic body. The ceramic body has an outer vertical wall, a bottom surface and a support surface. The support surface configured to support a substrate thereon. An RF electrode and a heater are disposed within the ceramic body. Additionally, a vertical ground electrode for the plasma RF return path is disposed inside the ceramic body along the outer vertical wall. The vertical ground electrode is suitable for handling high currents. The vertical ground electrode is electrically coupled to the ground electrode in the ceramic body. The stem is attached to the bottom surface of the ceramic body and includes a tubular wall. A ground is disposed through the stem and couples the vertical ground electrode to the plasma RF return path. Advantageously, the vertical ground electrode provides a proper ground along the outer vertical wall of the ceramic body outward the RF electrode and the heater. Braze connection between the stem and the ceramic body allows operation even at temperatures exceeding 650° Celsius. The vertical ground electrode reduces or eliminates parasitic plasma under the heater, thus, reducing the loss of power.

Embodiments herein are illustratively described below in reference to use in a PECVD system configured to process substrates. However, it should be understood that the disclosed subject matter has utility in other system configurations such as etch systems, other chemical vapor deposition systems, physical vapor deposition systems, and other systems in which a substrate is exposed to plasma within a process chamber. It should also be understood that embodiments disclosed herein may be adapted for practice in other process chambers configured to process substrates of various sized and dimensions.

Figure 1:
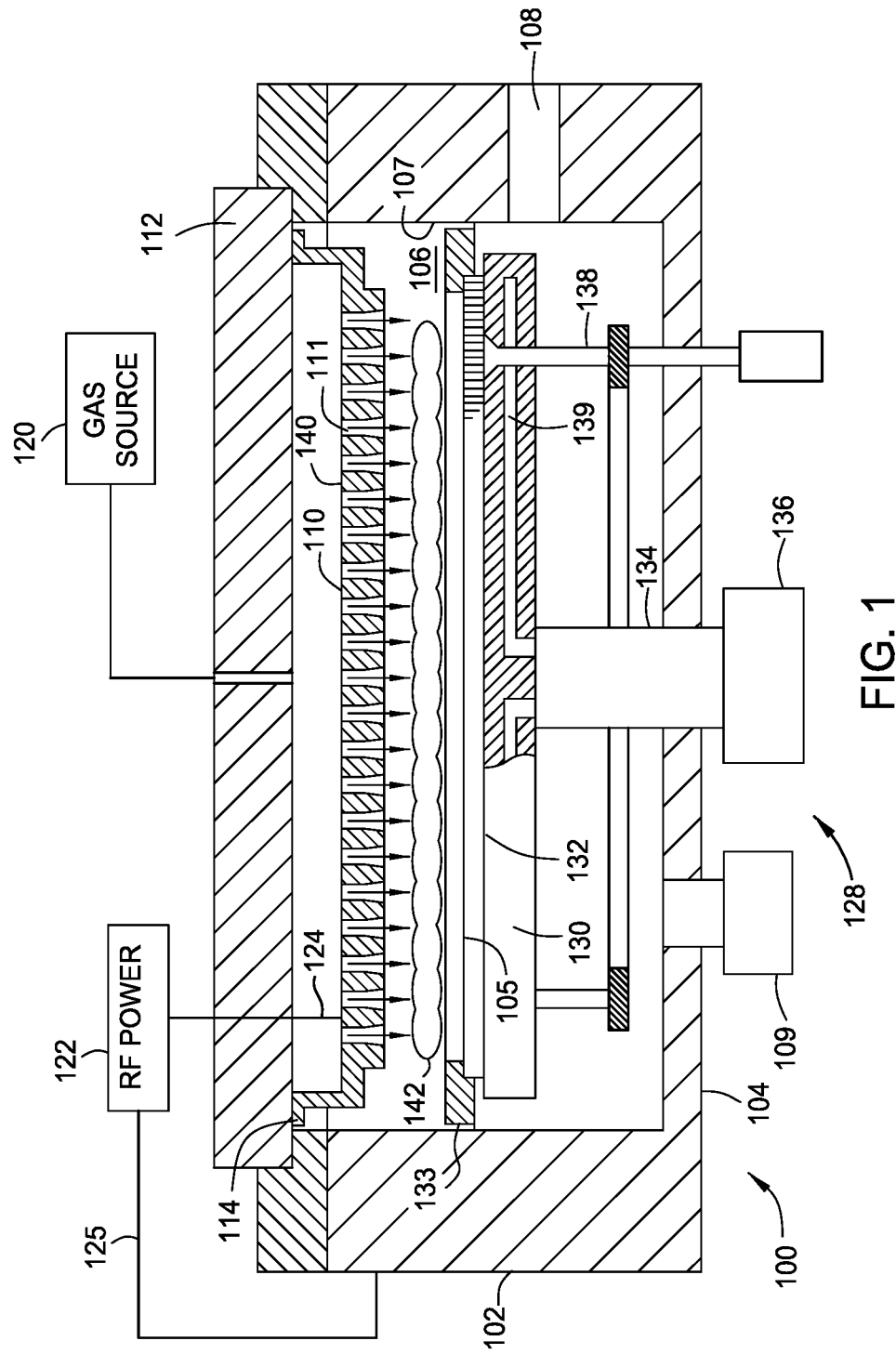
FIG. 1 is a schematic cross-sectional view of a process chamber including a substrate support assembly according to one embodiment.

FIG. 1 is a schematic cross-sectional view of a process chamber 100 including a substrate support assembly 128 according to one embodiment described herein. In the example of FIG. 1, the process chamber 100 is a PECVD chamber. As shown in FIG. 1, the process chamber 100 includes one or more sidewalls 102, a bottom 104, a gas distribution plate 110, and a cover plate 112. The sidewalls 102, bottom 104, and cover plate 112, collectively define a processing volume 106. The gas distribution plate 110 and substrate support assembly 128 are disposed in the processing volume 106. The processing volume 106 is accessed through a sealable slit valve opening 108 formed through the sidewalls 102 such that a substrate 105 may be transferred in and out of the process chamber 100. A vacuum pump 109 is coupled to the chamber 100 to control the pressure within the processing volume 106.

The gas distribution plate 110 is coupled to the cover plate 112 at its periphery. A gas source 120 is coupled to the cover plate 112 to provide one or more gases through the cover plate 112 to a plurality of gas passages 111 formed in the cover plate 112. The gases flow through the gas passages 111 and into the processing volume 106 toward the substrate receiving surface 132.

An RF power source 122 is coupled to the cover plate 112 and/or directly to the gas distribution plate 110 by an RF power feed 124 to provide RF power to the gas distribution plate 110. Various RF frequencies may be used. For example, the frequency may be between about 0.3 MHz and about 200 MHz, such as about 13.56 MHz. An RF return path 125 couples the substrate support assembly 128 through the sidewall 102 to the RF power source 122. The RF power source 122 generates an electric field between the gas distribution plate 110 and the substrate support assembly 128. The electric field forms a plasma from the gases present between the gas distribution plate 110 and the substrate support assembly 128. The RF return path 125 completes the electrical circuit for the RF energy prevents stray plasma from causing RF arcing due to a voltage differential between the substrate support assembly 128 and the sidewall 102. Thus the RF return path 125 mitigates arcing which causes process drift, particle contamination and damage to chamber components.

The substrate support assembly 128 includes a substrate support 130 and a stem 134. The stem 134 is coupled to a lift system 136 that is adapted to raise and lower the substrate support assembly 128. The substrate support 130 includes a substrate receiving surface 132 for supporting the substrate 105 during processing. Lift pins 138 are moveably disposed through the substrate support 130 to move the substrate 105 to and from the substrate receiving surface 132 to facilitate substrate transfer. An actuator 114 is utilized to extend and retract the lift pins 138. A ring assembly 133 may be placed over periphery of the substrate 105 during processing. The ring assembly 133 is configured to prevent or reduce unwanted deposition from occurring on surfaces of the substrate support 130 that are not covered by the substrate 105 during processing.

The substrate support 130 may also include heating and/or cooling elements 139 to maintain the substrate support 130 and substrate 105 positioned thereon at a desired temperature. In one embodiment, the heating and/or cooling elements 139 may be utilized to maintain the temperature of the substrate support 130 and substrate 105 disposed thereon during processing to less than about 800° C. or less. In one embodiment, the heating and/or cooling elements 139 may be used to control the substrate temperature to less than 650° C., such as between 300° C. and about 400° C. The substrate support 130 is described in further detail in FIGS. 2A-2D and FIGS. 3A-3B below.

FIGS. 2A-2D are schematic cross-sectional views of the substrate support assembly 128 of FIG. 1 having one embodiment of the substrate support 130. FIGS. 2A through 2D depict the simplified assembly, or construction, of the substrate support assembly 128 over four snapshots in time. The figures illustrate the creation of a ground electrode inside and along the outer periphery of a substrate support 130, one embodiment of substrate support 130. The creation of the substrate support 130 will be discussed sequentially from FIG. 2A through FIG. 2D. However, it should be appreciated that the substrate support 130 depicted in FIG.

Figure 2A:
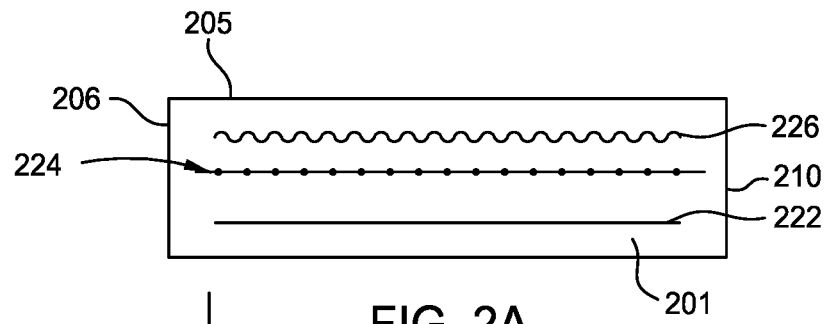
FIGS. 2A-2D are schematic cross-sectional views of the substrate support assembly of FIG. 1 having one embodiment of the substrate support.
Figure 2B:
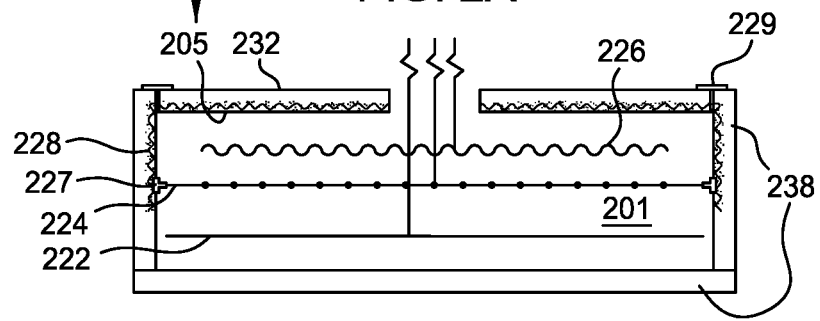
Figure 2C:
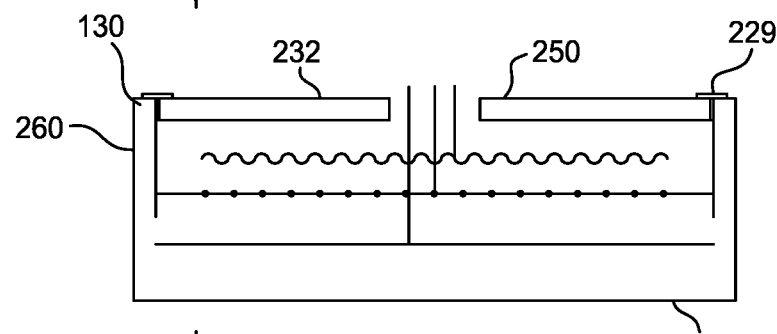
Figure 2D:
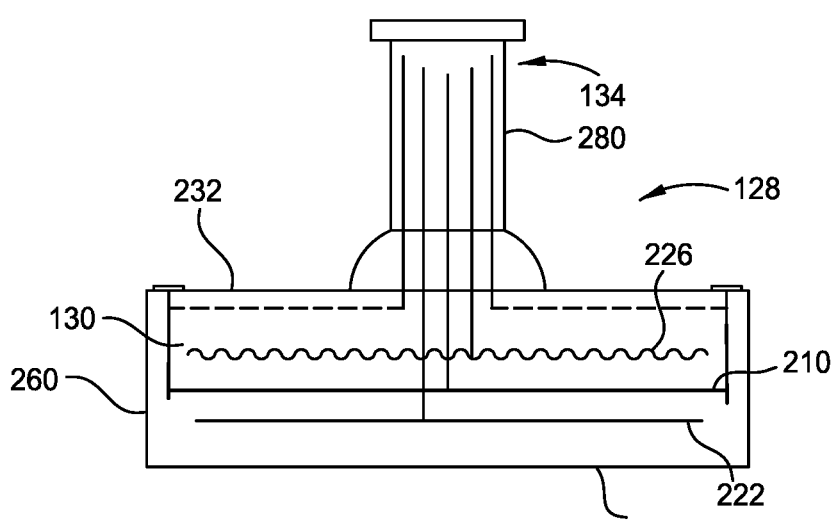

2A through FIG. 2D can be formed utilizing a number of different techniques and possibly even different sequences of operations.

FIG. 2A illustrates a body 210 having a side surface 206, a support surface 204 and a bottom surface 205. The view of the body 210 is flipped upside down in FIG. 2A. A RF mesh 224 is disposed within the body 210. A high voltage chucking electrode 222 and an optional heater 226 are also disposed within the body 210. The RF mesh 224, the high voltage chucking electrode 222 and the heater 226 each have connections extending individually through the bottom surface 205 of the body 210. The connections provide separate control and power to each of the RF mesh 224, the high voltage chucking electrode 222 and the heater 226. The body 210 is of a ceramic material. The body 210 may be formed by sintering the ceramic material, such as aluminum nitride (AlN) or aluminum oxide powder or other suitable material. The RF mesh 224 is embedded in the body 210. The RF mesh 224 has electrical connections extending through the bottom surface 205 of the body 210.

FIG. 2B illustrates the body 201 surrounded on the bottom surface 205 and the side surface 206 by a ground electrode 228. The ground electrode 228 may form a continuous cylindrical wall or alternatively a cage like structure around the body 210 along the side surface 206. For example, the cage like structure may be formed by a 3 to 24 pins for the ground electrode 228. Each pin of the ground electrode 228 may be between about 0.5 mm to about 2 mm in diameter. The pins are formed from an RF conductive material such as molybdenum. That is, the ground electrode 228 may be continuous inside along a radius of the body 201 or alternately discontinuous inside along the radius. In this manner, the ground electrode 228 forms a ground path completely around the side surface 206 of the ESC 200. The body 201 and ground electrode 228 is surrounded by a cover layer 238. A contact pad 229 may extend through the cover layer 238 along a mounting surface 232 on the bottom of an ESC body 250 for the substrate support 130. The contact pad 229 configured to electrically couple the ground electrode 228 with an RF gasket or other connection. The cover layer 238 may be AlN powder or other suitable ceramic material. Alternately, the cover layer 238 may be another dielectric material suitable for exposure in a plasma processing environment. The ground electrode 228 extends through the cover layer 238 at the bottom surface 205 of the body 210 to provide electrical connections thereto. A button 227 may is formed from a RF conductive material. The button 227 extends between the RF mesh 224 and the ground electrode 228 and completes the electric circuit therebetween. The button 227 may be formed from molybdenum or other suitable metal material. The RF mesh 224, embedded in the body 201, has electrical connections extending through the cover layer 238 at the bottom surface 205 of the body 210 to provide electrical connections thereto.

FIG. 2C illustrates the cover layer 238 encapsulating the ground electrode 228 and the body 210 to form the ESC 130. The cover layer 238 may be sintered to form an unitary structure with the body 210. The ESC 130 has an ESC body 250. The ESC body 250 has a support surface 204, sides 260, and a mounting surface 232. The mounting surface 232 corresponds to the bottom surface 205 of the body 210. The mounting surface 232 has electrical connections corresponding to the ground electrode 228 extending therethrough. The mounting surface 232 additionally may have electrical connections for one or more of the RF mesh 224, high voltage chucking electrode 222 and the heater 226 extending therethrough for proving power and control to the respective RF mesh 224, high voltage chucking electrode 222 and the heater 226. The ground electrode 228 and/or contact pad 229 coming out at the bottom may be protected by yttrium, aluminum, nickel or a nickel-cobalt ferrous alloy.

FIG. 2D illustrates a stem 134 attached to the mounting surface 232 of the ESC body 250 for forming the substrate support assembly 128. The stem 280 may be attached by any suitable techniques such as gluing, mechanical fasteners, brazing, welding, etc. The respective RF mesh 224, high voltage chucking electrode 222 and the heater 226 are electrically coupled to wiring routed inside the stem 280. The connection for the ground electrode 228 may be electrically coupled to the stem 280. Alternately, the ground electrode 228 is electrically coupled to wiring or other conductive elements inside the stem 280. The electrical connection for the ground electrode 228 in the stem 280 will be discussed further below with respect to FIG. 4.

Figure 3A:
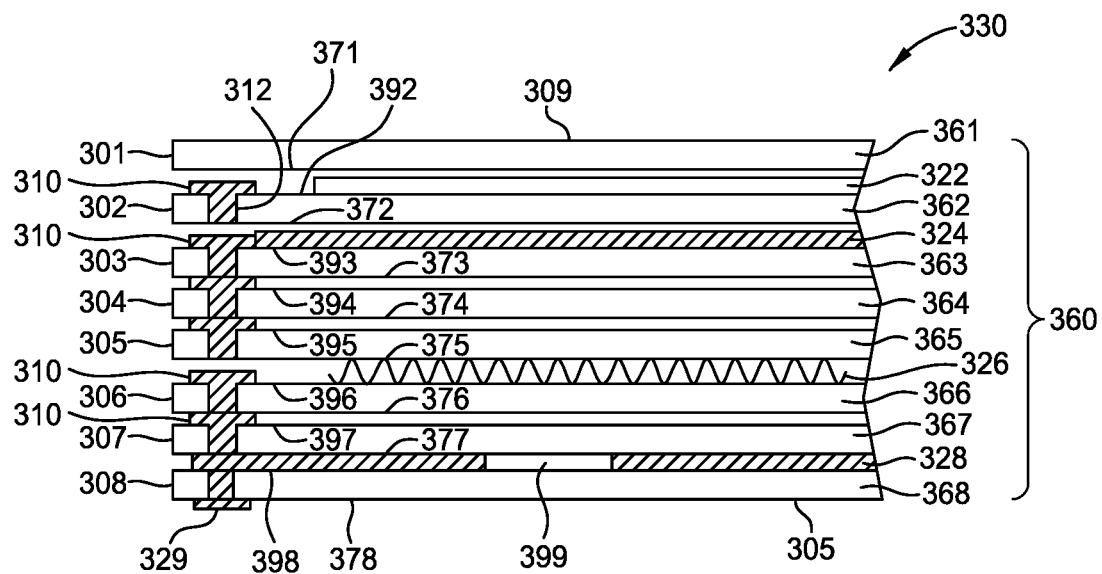
FIG. 3A-3B is schematic cross-sectional view of a substrate support according to another embodiment that may be used to replace the substrate support of FIG. 1.
Figure 3B:
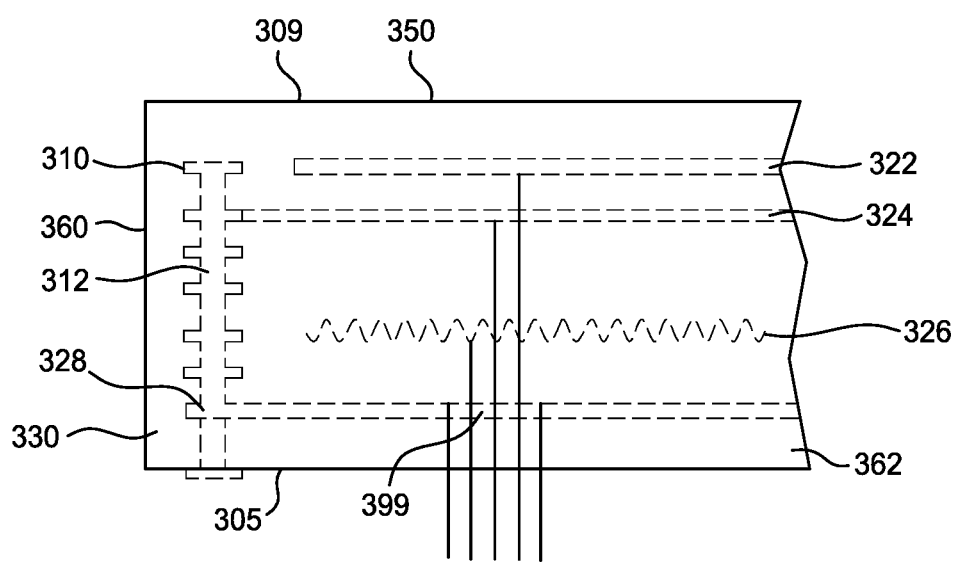

FIG. 3A-3B is schematic cross-sectional view of a substrate support 330 according to another embodiment that may be used to replace the substrate support 130 of FIG. 1. The substrate support 330 is formed from a plurality of sheets which may be printed, glued, sintered or formed by one or more suitable techniques, including in a plasma processing chambers such as one or more a deposition chambers, etch chambers, etc.

In FIG. 3A, the substrate support 330 is formed from a plurality of layers. In one embodiment, the substrate support 330 is formed from a first layer 301, a second layer 302, a third layer 303, a fourth layer 304, a fifth layer 305, a sixth layer 306, a seventh layer 307 and an eighth layer 308. It should be appreciated that the substrate support 330 may be formed from more or less than eight layers. However, further discussion will be to the embodiment described above wherein the number of layers forming the substrate support 330 is eight.

The first layer 301 has a first top surface 309, a first bottom surface 371 and a first side surface 361. The second layer 302 has a second top surface 392, a second bottom surface 372 and a second side surface 362. The third layer 303 has a third top surface 393, a third bottom surface 373 and a third side surface 363. The fourth layer 304 has a fourth top surface 394, a fourth bottom surface 174 and a fourth side surface 364. The fifth layer 305 has a fifth top surface 395, a fifth bottom surface 375 and a fifth side surface 365. The sixth layer 306 has a sixth top surface 396, a sixth bottom surface 376 and a sixth side surface 366. The seventh layer 307 has a seventh top surface 397, a seventh bottom surface 377 and a seventh side surface 367. The eighth layer 308 has an eighth top surface 398, an eighth bottom surface 378 and an eighth side surface 368.

A plurality of ground electrical pads 310 are disposed between the first bottom surface 371 and the second top surface 392 proximate the first side surface 361. The ground electrical pads 310 are formed from a conductive material such as a metal. A HV electrode 322 may additionally be disposed between the first bottom surface 371 and the second top surface 392. A plurality of vias 312 in the second layer 302 are disposed below the plurality of ground electrical pads 310 on the second top surface 392 of the second layer 302 proximate the second side surface 362. The vias 312 are filed with conductive material, such as the same conductive material of the pads, and electrically connected to the ground electrical pads 310. The number of vias 312 corresponds to the number of ground electrical pads 310. In another example, twice as many vias 312 are formed in the second layer 302 as there are ground electrical pads 310 disposed between the second layer 302 and the first layer 301. It is important to appreciate that each ground electrical pad 310 has one or more corresponding vias 312 filled with conductive material attached and electrically coupled thereto.

Additional ground electrical pads 310 are disposed between the second bottom surface 372 and the third top surface 393 proximate the second side surface 362. Vias 312 in the third layer 303 are disposed below the plurality of ground electrical pads 310 on the third top surface 393 proximate the third side surface 363. The ground electrical pads 310, between the second bottom surface 372 and the third top surface 393, are electrically coupled to the vias 312 in the second layer 302 and the vias in the third layer 303. An RF mesh 324 may additionally be disposed between the second bottom surface 372 and the third top surface 393. In one embodiment, the vias 312 in the second layer 302 are aligned with the vias 312 in the third layer. However, the alignment of the vias 312 in the respective second layer 302 and third layer 303 are less important than the electrical conductivity therebetween. In a second embodiment, the vias 312 in the second layer 302 are not aligned with the vias 312 in the third layer 303.

Additional ground electrical pads 310 are disposed between the third bottom surface 373 and the fourth top surface 394 proximate the fourth side surface 364. Vias 312 in the fourth layer 304 are disposed below the plurality of ground electrical pads 310 on the fourth top surface 394 proximate the fourth side surface 364. The ground electrical pads 310, between the third bottom surface 373 and the fourth top surface 394, are electrically coupled to the vias 312 in the third layer 303 and the vias 312 in the fourth layer 304. As discussed above, the vias 312 in the third layer 303 are electrically coupled to the vias 312 in the fourth layer 304 by way of the ground electrical pads 310.

Additional ground electrical pads 310 are disposed between the fourth bottom surface 374 and the fifth top surface 395 proximate the fourth side surface 364. Vias 312 in the fifth layer 305 are disposed below the plurality of ground electrical pads 310 on the fifth top surface 395 proximate the fifth side surface 365. The ground electrical pads 310, between the fourth bottom surface 374 and the fifth top surface 395, are electrically coupled to the vias 312 in the fourth layer 304 and the vias 312 in the fifth layer 305. As discussed above, the vias 312 in the fourth layer 304 are electrically coupled to the vias 312 in the fifth layer 305 by way of the ground electrical pads 310.

Additional ground electrical pads 310 are disposed between the fifth bottom surface 375 and the sixth top surface 396 proximate the fifth side surface 365. Vias 312 in the sixth layer 306 are disposed below the plurality of ground electrical pads 310 on the sixth top surface 396 proximate the sixth side surface 366. The ground electrical pads 310, between the fifth bottom surface 375 and the sixth top surface 396, are electrically coupled to the vias 312 in the sixth layer 306 and the vias in the fifth layer 305. A heater coil 326 may optionally be disposed between the fifth bottom surface 375 and the sixth top surface 396. As discussed above, the vias 312 in the fifth layer 305 are electrically coupled to the vias 312 in the sixth layer 306 by way of the ground electrical pads 310.

Additional ground electrical pads 310 are disposed between the sixth bottom surface 376 and the seventh top surface 397 proximate the sixth side surface 366. Vias 312 in the seventh layer 307 are disposed below the plurality of ground electrical pads 310 on the seventh top surface 397 proximate the seventh side surface 367. The ground electrical pads 310, between the sixth bottom surface 376 and the seventh top surface 397, are electrically coupled to the vias 312 in the sixth layer 306 and the vias 312 in the seventh layer 307. As discussed above, the vias 312 in the sixth layer 306 are electrically coupled to the vias 312 in the seventh layer 307 by way of the ground electrical pads 310.

A ground electrode 328 is disposed between the seventh bottom surface 377 and the eighth top surface 398. The ground electrode 328 extends to the eighth side surface 368. The eighth layer 308 has a center 399. The ground electrode 328 extends through the center 399 for making electrical connections thereto. The vias 312 may additionally extend through the eighth layer 308. A ground pad 329 may be electrically coupled to the ground electrode 328 through the via 312. The ground pad 329 configured to electrically couple the ground electrode 328 with an RF gasket or other connection. The HV electrode 322, RF mesh 324, and heater coil 326 have electrical connections extending through the center 399 for providing power and control to the respective HV electrode 322, RF mesh 324, and heater 386. The ground electrode 328 and/or ground pad 329 coming out at the bottom may be protected by yttrium, aluminum, nickel or a nickel-cobalt ferrous alloy.

FIG. 3B illustrates the ESC 330 formed from the assembly of the first layer 301 through eighth layer 308 discussed above. With the arrangement of electrically coupled vias 312 and ground electrical pads 310 disposed within the ESC 330 adjacent the side surface 360 between the first layer 301 and the eighth layer 308, each via 312 of the plurality of vias 312 and each ground electrical pad 310 form a ground path through the ESC 330 adjacent the side surface 360. The vias 312 are substantially orthogonal a substrate support surface 350 of the ESC 330. The vias 312 and ground electrical pads 310 to the disposed within the body of the ESC 330 in a cylindrical pattern. The vias 312 and ground electrical pads 310 may form a continuous cylindrical wall or alternatively a cage like structure. For example, the cage like structure may be formed by a 3 to 24 pin like structure for the vias 312. Each via 312 may be between about 0.5 mm to about 2 mm in diameter. The vias may be metal filled forming a continuous conductive pathway. Alternatively, the vias 312 may be continuous along a radius of the ESC 330. In this manner, the vias 312 form a ground path completely around the side surface 360 of the ESC 330.

Figure 4:
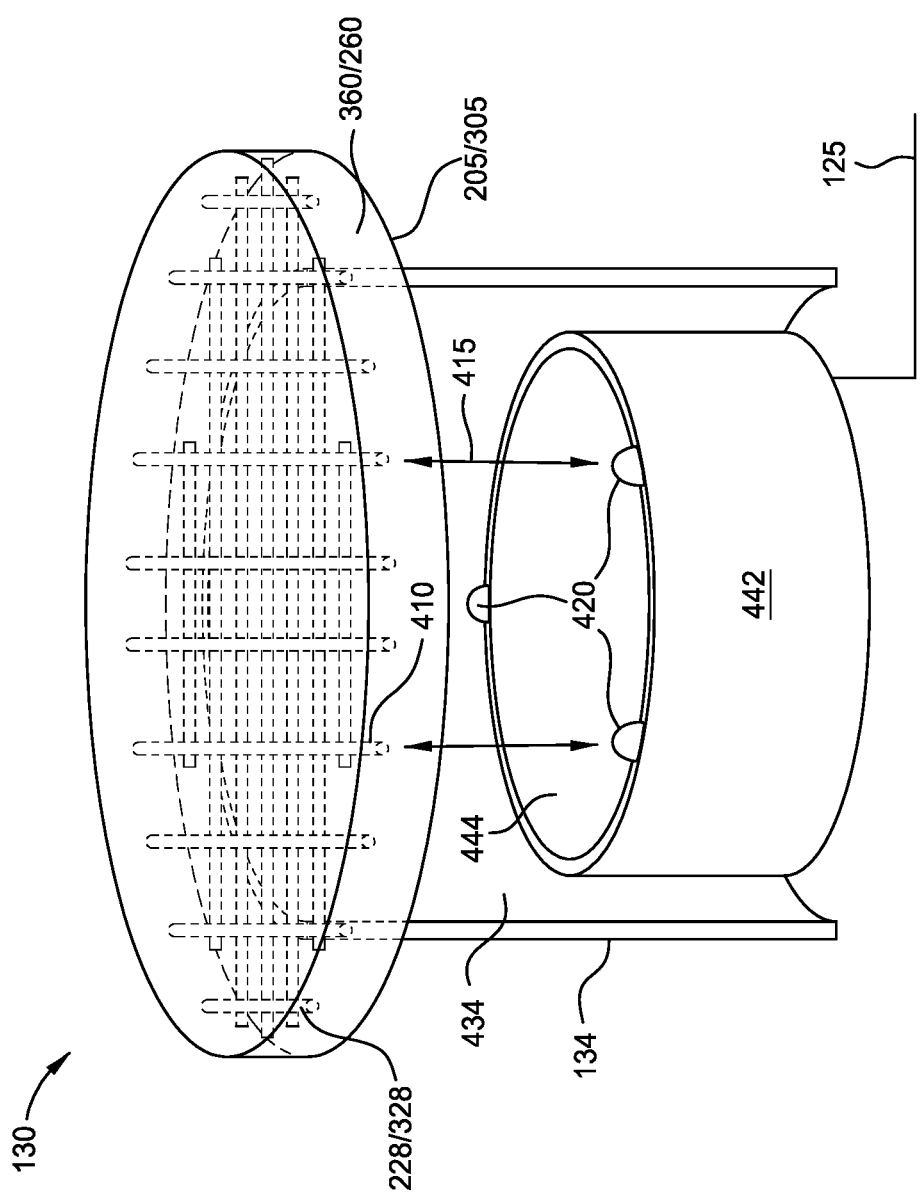
FIG. 4 is schematic perspective view of the substrate support assembly and stem of FIG. 1 according to one embodiment.

The electrical coupling of the ground electrode 228/328 to the stem will now be discussed with respect to FIG. 4. FIG. 4 is schematic perspective view of the substrate support assembly 128 of FIG. 1 according to one embodiment. The ESC 330 of FIGS. 3A-3B is equally suitable for the substrate support assembly 128 and the electrical ground connection discussed with respect to FIG. 4. The stem 134 may be attached to the ESC 130/330 by a number of suitable techniques for forming the substrate support assembly 128. For example, the stem 134 may be welded, chemically bonded, or mechanically bonded to the ESC 130/330. In one embodiment, the stem 134 is diffusion bonded to the ESC 130/330.

The stem 134 has a hollow interior 434. A metal ground tube 442 is disposed within the hollow interior 434 of the stem 134. The metal ground tube 442 is a circular cylinder of metal. The metal ground tube 442 may be formed from Mo, Au or Ag coated moly or nickel-cobalt ferrous alloy, or other suitable material. The metal ground tube 442 has an interior area 444. The interior area 444 is configured to provide space for electrical connections to the ESC 130 to pass therethrough the metal ground tube 442. A RF grounding coax return (Shown in FIGS. 2A through 2D and 3B) is provided for the ground mesh 228/328 through the metal ground tube 441. The metal ground tube 442 has a plurality of ground tube connectors 420. The ground tube connectors 420 are configured to mate with a respective mesh connector 410 as shown by arrow 415. The ground tube connectors 420 may be tabs or protrusions in the metal ground tube 442. The ground tube connectors 420 may fit into the respective mesh connector 410 to provide an electrical connection with the ground mesh 228/238 for completing the ground path. In one embodiment, the ground electrode 228 is brazed at the ground tube connectors 420 for completing the ground return path disposed within the sides 260/360 of the ESC 130/330. Thus, a RF shield is produced at the bottom and edge of substrate support 130 by a shielding effect wherein RF will be present on wires inside shaft, the heater and the RF mesh.

Figure 5:
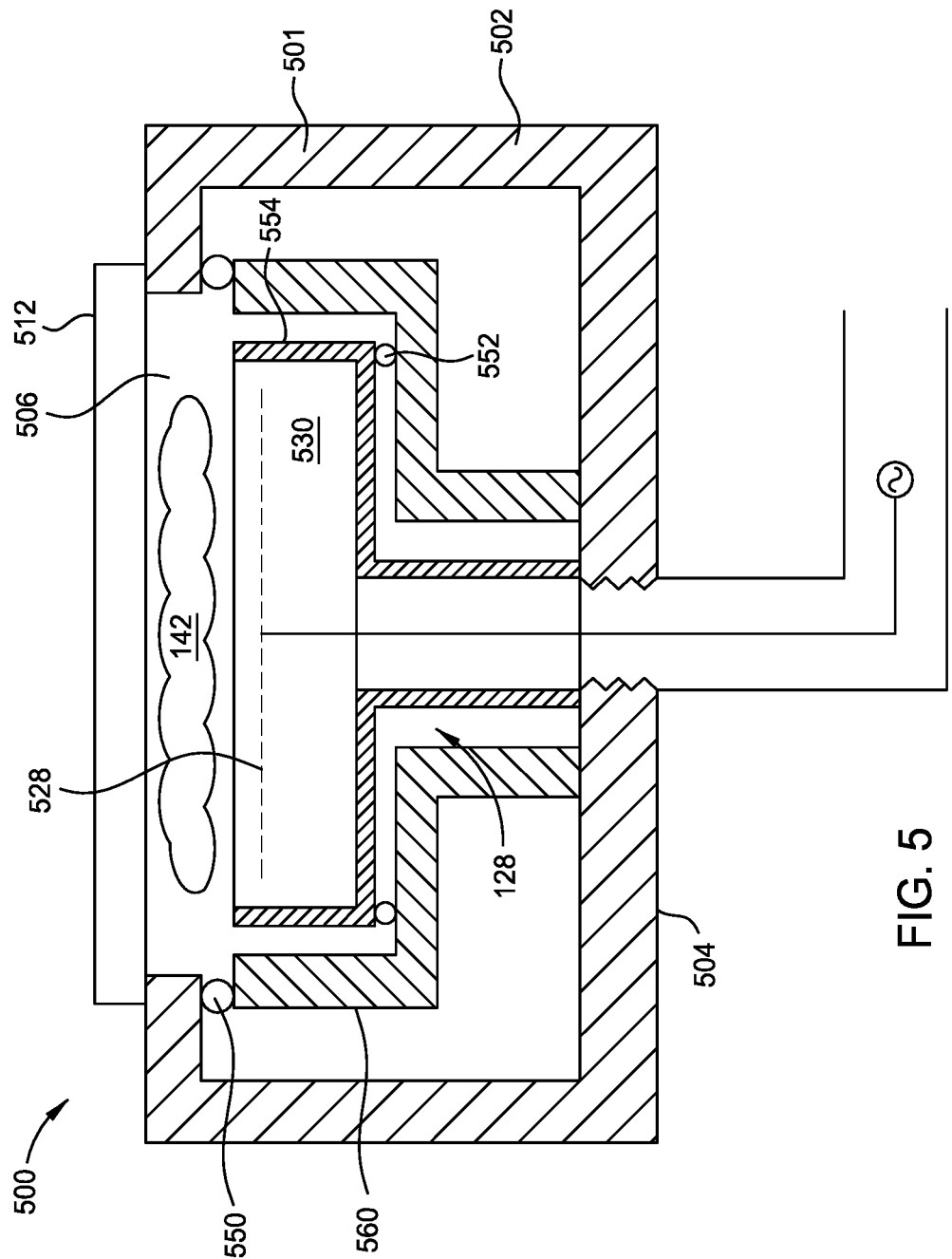
FIG. 5 is a schematic cross-sectional view of a process chamber including a substrate support assembly according to second embodiment.

FIG. 5 is a schematic cross-sectional view of a processing chamber 500 including the substrate support assembly 128 according to second embodiment. The processing chamber 500 has a body 501. The body 501 has sidewalls 502, a bottom 504 and a cover plate 512. The sidewalls 502, a bottom 504 and a cover plate 512 define an interior volume 506 of the processing chamber 500. Disposed within interior volume 506 of the processing chamber 500 is the substrate support assembly 128. A plasma 142 may form in the interior volume and be maintained by RF energy supplied through the processing chamber 500.

The substrate support assembly 128 has an ESC 530 and a metal ground tube 560. A chucking electrode 528 is disposed within the ESC 530. A metal coating 554 is disposed on an outer surface of the substrate support assembly 128. The metal coating 554 may be formed from molybdenum, aluminum, copper or other suitably conductive material. The metal coating 554 is electrically coupled to the RF ground loop.

The metal ground tube 560 may be formed from molybdenum, aluminum, copper or other suitably conductive material. The metal ground tube 560 is electrically coupled to the RF ground loop. One or more RF gaskets 550, 552 may be disposed between the metal ground tube 560 and the chamber components which are part of the RF ground path. The RF gaskets 550, 552 are conductive to RF energy and transmit RF energy therethrough for forming the RF ground circuit. The RF gasket 550, 552 can be formed from nickel, copper, aluminum, molybdenum or other suitable material. The RF gaskets 550 are disposed between the metal ground tube 560 and the sidewall 502 or cover plate 512 of the processing chamber 500. Additionally, RF gaskets 552 may be disposed between the metal ground tube 560 and the metal coating 554 for coupling the RF energy therebetween. Advantageously, the RF ground return path can be made short for reducing the resistance in the ground path and reducing the voltage drop between various chamber components to prevent arcing.

Figure 6:
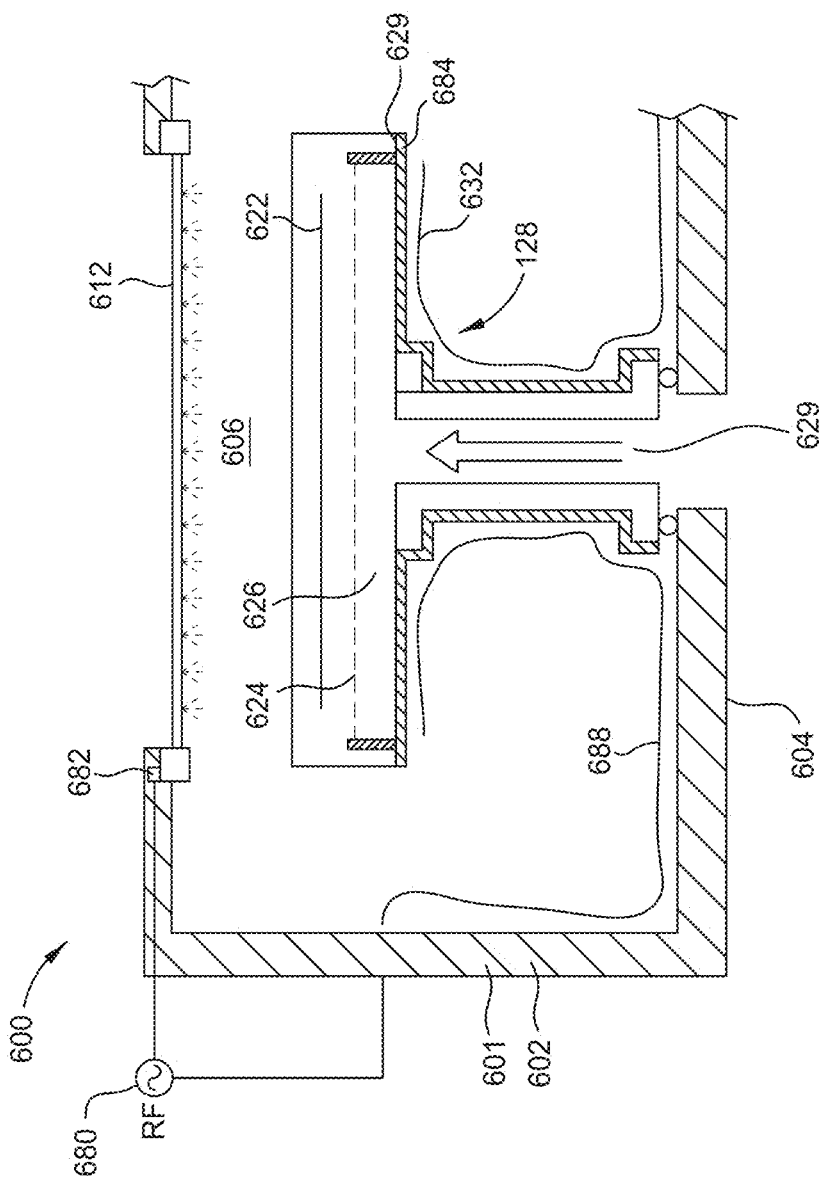
FIG. 6 is a partial schematic cross-sectional view of a process chamber including a substrate support assembly according to third embodiment

FIG. 6 is a partial schematic cross-sectional view of a processing chamber 600 including the substrate support assembly 128 according to third embodiment. The processing chamber 600 has a body 601. The body has sidewalls 602, a bottom 604 and a showerhead 612. The sidewalls 602, bottom 604 and showerhead 612 define an interior volume 606. The substrate support assembly 128 is disposed within the interior volume 606. A RF generator 680 is coupled an electrode 682 in the showerhead 612. The RF generator 680 has a RF return path 688 for completing the RF circuit when plasma is present.

The substrate support assembly 128 has a heater 626, a HV chucking mesh 622, and a RF mesh 624 disposed therein. The substrate support assembly 128 has an exterior surface 629. A metal coating 684 is disposed on the exterior surface 629 of the substrate support assembly 128. The metal coating 684 is formed from nickel, copper, aluminum, molybdenum or other suitable material. The metal coating 684 is part of the RF return path 688 and completes the ground for the RF when the RF generator 680 is powered on. A protective coating 632 may be disposed on the metal coating 684 to protect the metal coating 684 from corrosion and help maintain the conductivity of the metal coating 684. The protective coating 632 may be formed from yttria, AlN, $Al_2O_3$ or other suitable material. The protective coating 632 maintains the connection for the RF ground path for the substrate support assembly 128. Advantageously, the RF ground path for maintaining the plasma can be maintained and provide a long service life for the substrate support assembly 128.

Figure 7:
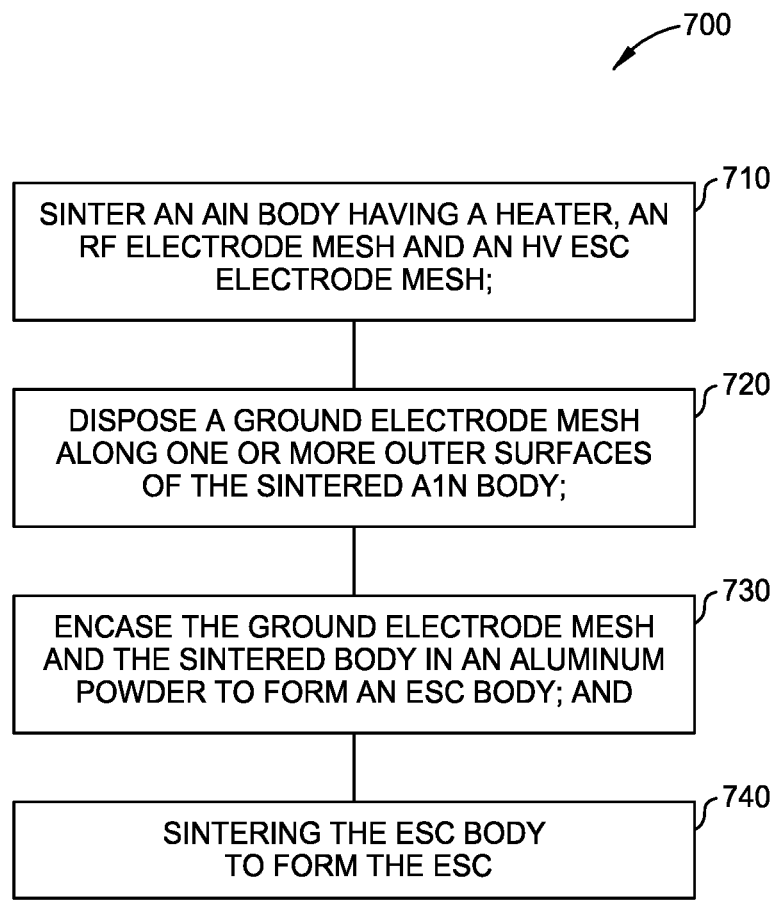
FIG. 7 is a method for forming an ESC.

FIG. 7 is a method 700 for forming an ESC. The method 700 begins at operation 710 by sintering an AlN body having a heater, an RF electrode mesh and an HV ESC electrode mesh. At operation 720, a ground electrode mesh is disposed along one or more outer surfaces of the sintered AlN body. At operation 730, the ground electrode mesh and the sintered body are encased in an aluminum powder to form an ESC body. At operation 740, the ESC body is sintered to form the ESC.

Figure 8:
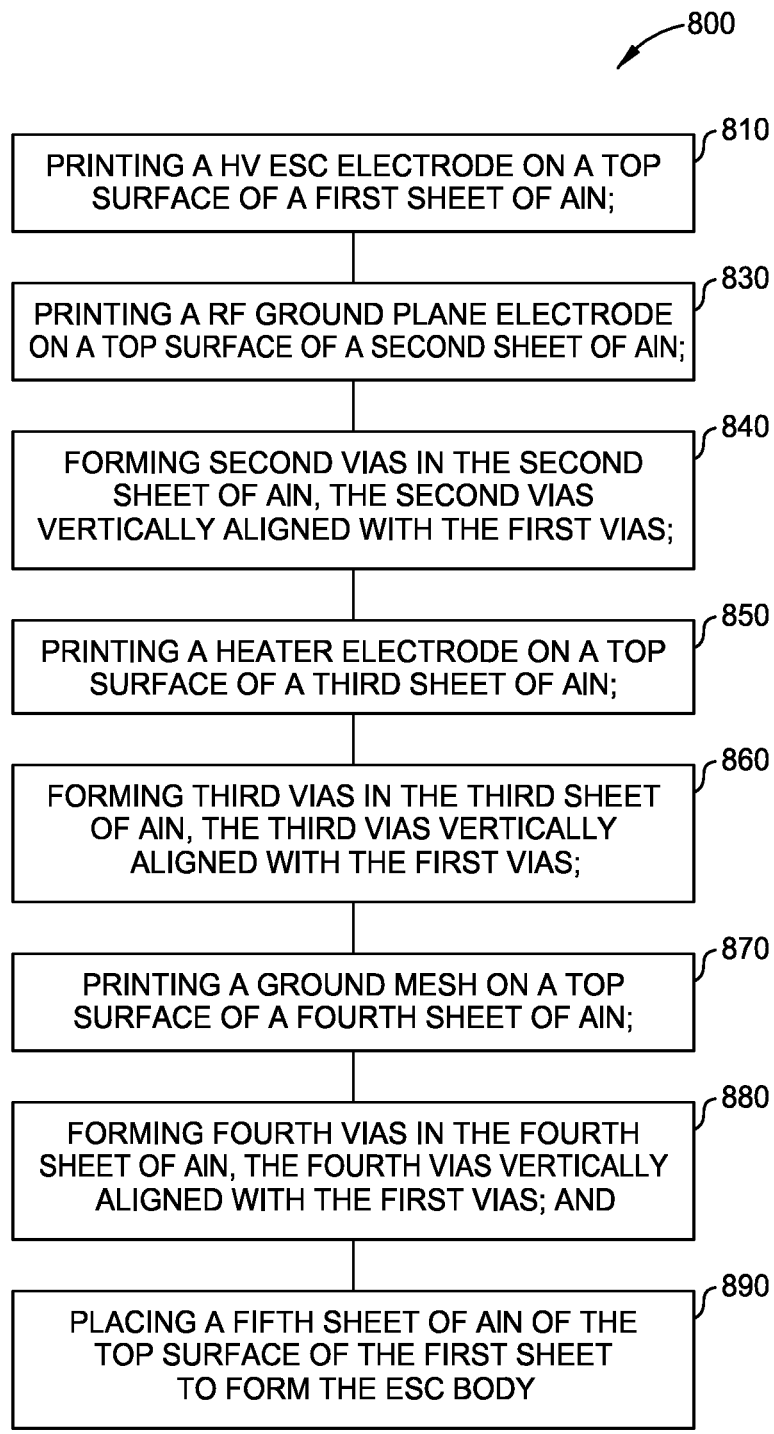
FIG. 8 is another method for forming an ESC.

FIG. 8 is another method 800 for forming an ESC. The method 800 begins at operation 810 by printing a HV ESC electrode on a top surface of a first sheet of AlN. At operation 830, ground plane electrode is printed on a top surface of a second sheet of ceramic. At operation 840, a plurality of second vias is formed in the second sheet of ceramic and connected to the ground plane electrode. At operation 850, one or more heater electrodes is printed on a top surface of a third sheet of ceramic. At operation 860, a plurality of third vias is formed in the third sheet of ceramic, the third vias vertically aligned with the second vias. At operation 870, a ground mesh is printed on a top surface of a fourth sheet of ceramic. The ground mesh is electrically coupled through the vias to the ground plane electrode. At operation 880, a plurality of fourth vias is formed in the fourth sheet of ceramic, the fourth vias vertically aligned with the second vias. At operation 890, a fifth sheet of ceramic is placed on the top surface of the first sheet to for the ESC body.

While the foregoing is directed to embodiments of the present disclosure, other and further embodiments of the disclosure may be devised without departing from the basic scope thereof, and the scope thereof is determined by the claims that follow.

What is claimed is:

1. A method for forming an electrostatic cuck (ESC), the method comprising:
   sintering an aluminum nitride (AlN) body having an high voltage (HV) ESC electrode and a radio frequency (RF) mesh disposed therein;
   disposing a cylindrical ground electrode along one or more outer surfaces of the sintered AlN body and coupling the cylindrical ground electrode to the RF mesh;
   encasing the cylindrical ground electrode and the sintered body with a dielectric material to form an ESC body; and
   joining the dielectric material with the ESC body to form the ESC.

2. The method of claim 1, wherein the cylindrical ground electrode is continuous along a radius of the ESC body and a coax ground return is additionally provided to the RF mesh.

3. The method of claim 1, wherein the cylindrical ground electrode is a vertical cage shape disposed in the ESC body.

4. The method of claim 1 further comprising:
   attaching a metal ground tube to the cylindrical ground electrode, wherein the metal ground tube is disposed in a stem attached to the ESC body.

* * * * *